United States Patent
Minato et al.

(10) Patent No.: US 11,451,008 B2
(45) Date of Patent: Sep. 20, 2022

(54) OPTICAL SEMICONDUCTOR DEVICE

(71) Applicant: FURUKAWA ELECTRIC CO., LTD., Tokyo (JP)

(72) Inventors: Ryuichiro Minato, Tokyo (JP); Yutaka Ohki, Tokyo (JP)

(73) Assignee: FURUKAWA ELECTRIC CO., LTD., Tokyo (JP)

(*) Notice: Subject to any disclaimer, the term of this patent is extended or adjusted under 35 U.S.C. 154(b) by 0 days.

(21) Appl. No.: 16/929,254

(22) Filed: Jul. 15, 2020

(65) Prior Publication Data

US 2020/0366060 A1 Nov. 19, 2020

Related U.S. Application Data

(63) Continuation of application No. PCT/JP2019/005350, filed on Feb. 14, 2019.

(30) Foreign Application Priority Data

Feb. 16, 2018 (JP) .............................. JP2018-025526

(51) Int. Cl.
*H01S 5/042* (2006.01)
*H01S 5/022* (2021.01)
*H01S 5/065* (2006.01)

(52) U.S. Cl.
CPC ............ *H01S 5/0653* (2013.01); *H01S 5/022* (2013.01); *H01S 5/04256* (2019.08)

(58) Field of Classification Search
CPC ............... H01S 5/02212; H01S 5/0233; H01S 5/02492; H01S 5/02345

(Continued)

(56) References Cited

U.S. PATENT DOCUMENTS 5,325,382 A * 6/1994 Emura ................ H01S 5/06256
                                                          372/50.1
5,684,816 A    11/1997 Takagi
(Continued)

FOREIGN PATENT DOCUMENTS

JP    58-50790 A    3/1983
JP    62-37909 B2   8/1987
(Continued)

OTHER PUBLICATIONS

International Search Report dated Apr. 23, 2019 in PCT/JP2019/005350 filed Feb. 14, 2019. 1 page.

(Continued)

*Primary Examiner* — Tuan N Nguyen
(74) *Attorney, Agent, or Firm* — Oblon, McClelland, Maier & Neustadt, L.L.P.

(57) ABSTRACT

An optical semiconductor device includes a semiconductor multilayer structure, an active region interposed between a first facet on a light emitting side and a second facet opposing to the first facet, and a first electrode layer provided on a top of the semiconductor multilayer structure and a second electrode layer provided on a bottom of the semiconductor multilayer structure; and an electrical connection region connected to at least one of the first electrode layer and the second electrode layer of the optical semiconductor device and used for injecting a current to the active region, and $\alpha > \beta$ and $\beta > 0$ are satisfied where $\alpha$ is the contact area included in a half region on the first facet side in a top area of the optical semiconductor device and $\beta$ is the contact area included in a half region on the second facet side.

3 Claims, 10 Drawing Sheets

(58) Field of Classification Search
USPC .............................. 372/45.1, 38.05; 359/344
See application file for complete search history.

(56) References Cited

U.S. PATENT DOCUMENTS

| | | | |
|---|---|---|---|
| 5,757,832 A * | 5/1998 | Uchida | H01S 5/0625 385/11 |
| 5,793,521 A | 8/1998 | O'Brien et al. | |
| 6,148,013 A | 11/2000 | Geels et al. | |
| 6,148,014 A | 11/2000 | Geels et al. | |
| 6,181,721 B1 | 1/2001 | Geels et al. | |
| 6,272,162 B1 | 8/2001 | Geels et al. | |
| 6,307,873 B1 | 10/2001 | Geels et al. | |
| 6,731,427 B1 | 5/2004 | Wu | |
| 7,079,310 B2 * | 7/2006 | Chen | H01S 5/5072 359/344 |
| 9,570,885 B2 * | 2/2017 | Zhou | H01S 5/06251 |
| 2006/0268397 A1 * | 11/2006 | Saini | H01S 5/50 359/344 |
| 2007/0165585 A1 * | 7/2007 | Monden | H04L 12/5692 370/338 |
| 2007/0165685 A1 * | 7/2007 | Mizuuchi | H01S 5/0625 372/50.1 |
| 2010/0189152 A1 * | 7/2010 | Harder | H01S 5/02345 372/46.01 |

FOREIGN PATENT DOCUMENTS

| | | |
|---|---|---|
| JP | 3672272 B2 | 7/2005 |
| WO | WO 2005/062433 A1 | 7/2005 |

OTHER PUBLICATIONS

Extended European Search Report dated Nov. 18, 2021 in corresponding European Patent Application No. 19753933.1, 9 pages.

* cited by examiner

OPTICAL SEMICONDUCTOR DEVICE

CROSS-REFERENCE TO RELATED APPLICATIONS

This application is a Continuation of International Patent Application No. PCT/JP2019/005350, filed Feb. 14, 2019, which claims the benefit of Japanese Patent Application No. 2018-025526, filed Feb. 16, 2018, both of which are hereby incorporated by reference herein in their entirety.

BACKGROUND OF THE INVENTION

Field of the Invention

The present invention relates to an optical semiconductor device, in particular, a semiconductor laser device in which the optical output power of the laser is 100 mW or higher, furthermore, a high power semiconductor laser device in which the optical output power of the laser is several watts or higher.

Description of the Related Art

The semiconductor laser device is utilized as a laser used for optical communication, an industrial laser used for processing or the like, or the like. The laser used for optical communication is required to propagate a light in an optical fiber over a long distance (for example, several hundred kilometers), and a single mode laser is used in general in order to suppress deterioration of signal quality. On the other hand, since an industrial laser requires higher power than an optical communication laser but does not require long distance propagation, a multimode laser dedicated to high power is used for the industrial laser. In a multimode laser, high power is achieved by increasing the width of a laser waveguide to allow a plurality of modes (that is, multimode) inside the waveguide. Here, high power means optical output power of around several watts to 20 watts (both at a room temperature and in CW operation), for example, as the optical output power of a laser.

In a general semiconductor laser has a semiconductor multilayer structure formed on a substrate, an active region interposed between a first facet on a light emitting side and a second facet opposing to the first facet, a first electrode layer provided on the top of the semiconductor multilayer structure, and a second electrode layer provided on the bottom of the semiconductor multilayer structure.

In a high power semiconductor laser device, as illustrated in FIG. 1, a semiconductor laser device 1 is bonded to a substrate, which is referred to as a submount 6, in which a metal layer 4 of Au or the like is formed on a ceramics substrate 5 of AlN or the like. Furthermore, bonding wires 2 of Au or the like are connected to an electrode layer of the semiconductor laser device 1 as an electrical connection region used for injecting a current to the semiconductor laser device 1. FIG. 2 illustrates the configuration in which many bonding wires 2 are evenly arranged on the electrode layer of the high power semiconductor laser device 1 as an example of a conventional art (first conventional configuration). In general, since the diameter of the bonding wire 2 is significantly thin such as around 15 μm to 50 μm, it is necessary to connect a significantly large number of bonding wires 2 to the electrode layer of the semiconductor laser device 1 in a high power semiconductor laser device of several watts to 20 watts to which a large current of several amperes to 30 amperes is injected. However, the increased number of bonding wires 2 causes a disadvantage of an increase in cost of a material such as Au, an increase in process tact time, or the like. Furthermore, since the surface area of the semiconductor laser device 1 is significantly small (for example, 0.3 mm to 0.5 mm in width by 3 mm to 5 mm in length), there is a problem of a limited footprint used for connection of the bonding wires 2.

Accordingly, the inventors have referenced Japanese Patent No. 3672272 for the purpose of reducing the number of bonding wires without deteriorating the performance of a semiconductor laser device in a high power semiconductor laser device.

SUMMARY OF THE INVENTION

Japanese Patent No. 3672272 discloses that, since the consumption rate of carriers inside the active layer is slow in a region having a low photon density inside the active layer and is fast in a region having a high photon density, when a current supplied (injected) to the semiconductor laser device is even in the longitudinal direction of a resonator, carriers are insufficient in a region having a high photon density inside the active layer, and carriers are excessive in a region having a low photon density. Further, it is disclosed that such insufficient carriers inside the active layer cause the optical output of the semiconductor laser to be saturated. Further, to solve this problem, it is proposed to bond the wires to a position in the longitudinal direction of a resonator corresponding to a local maximum point in the longitudinal direction of the resonator in the photon density distribution inside the active layer.

The inventors have studied a configuration as illustrated in FIG. 3 (second conventional configuration) with reference to Japanese Patent No. 3672272. That is, in the semiconductor laser device 1 in which the reflectivity of a reflective layer formed on a first facet E1 is lower than the reflectivity of a reflective layer formed on a second facet E2, the first facet E1 part is the local maximum point of the photon density. Furthermore, the bonding wires 2, the number of which is the same as that of the configuration of FIG. 2, were arranged only on the first facet E1 side so as to be able to flow a current of several amperes or more in the high power semiconductor laser device 1.

As illustrated in FIG. 4A and FIG. 4B, however, in comparison in terms of the optical output power and the drive voltage between the first conventional configuration in which many bonding wires 2 are evenly arranged (the configuration in FIG. 2) and the second conventional configuration in which the bonding wires 2, the number of which is the same as that in the first conventional configuration, are arranged only on the first facet E1 side (the configuration in FIG. 3), the drive voltage is undesirably, significantly increased in the second conventional configuration that references Japanese Patent No. 3672272 while the optical output power is increased as expected. It is considered that this is because the bonding wires 2 generates heat and the electrical resistance increases due to current concentration to the bonding wires 2 bonded only on the first facet E1 side where the consumption rate of carriers is high.

In industrial lasers, a high electrical-optical conversion efficiency (Wall Plug Efficiency (WPE)) is demanded. The WPE is defined as a rate of the operating optical output power of a semiconductor laser device to supplied power (a product of a current and a voltage). Thus, an increase in the drive voltage results in a reduction in the WPE, which is not preferable in terms of the performance of a semiconductor laser.

The present invention provides a good performance optical semiconductor device, in particular, a high power semiconductor laser device that increases the optical output power while reducing the drive voltage, in particular, realizes an increase in the WPE.

Solution to Problem

According to one aspect of the present invention, provided is an optical semiconductor device having: an optical semiconductor device including a semiconductor multilayer structure, an active region interposed between a first facet on a light emitting side and a second facet opposing to the first facet, and a first electrode layer provided on a top of the semiconductor multilayer structure and a second electrode layer provided on a bottom of the semiconductor multilayer structure; and an electrical connection region connected to at least one of the first electrode layer and the second electrode layer of the optical semiconductor device and used for injecting a current to the active region, in which $\alpha > \beta$ and $\beta > 0$ are satisfied, where in a contact area between the electrical connection region and the optical semiconductor device, the contact area included in a half region on the first facet side in a top area of the optical semiconductor device is denoted as $\alpha$, and the contact area included in a half region on the second facet side is denoted as $\beta$.

According to another aspect of the present invention, provided is the optical semiconductor device described above in which a part of the electrical connection region connected to the half region on the second facet side in a top area of the optical semiconductor device is located near the second facet.

According to another aspect of the present invention, provided is the optical semiconductor device described above in which a part of the electrical connection region connected to the half region on the second facet side in a top area of the optical semiconductor device is located in a quarter region from the second facet side.

According to another aspect of the present invention, provided is the optical semiconductor device described above in which the electrical connection region is arranged and connected such that a current density distribution in a direction connecting the first facet and the second facet inside the active region is close to a photon density distribution in the same direction inside the active region.

According to another aspect of the present invention, provided is the optical semiconductor device described above in which the optical semiconductor device is a semiconductor laser device in which the optical output power from the first facet is greater than or equal to 100 mW.

According to another aspect of the present invention, provided is the optical semiconductor device described above in which the optical output power from the first facet is greater than or equal to 1 W, and the optical semiconductor device is a semiconductor laser device that oscillates the multimode laser.

According to another aspect of the present invention, provided is the optical semiconductor device described above in which the optical semiconductor device is a semiconductor optical amplifier device that is inputted with a laser from the second facet and outputs, from the first facet, the optical output power is greater than or equal to 10 mW.

DESCRIPTION OF THE EMBODIMENTS

The embodiments of an optical semiconductor device according to the present invention will be described below with reference to the drawings. Note that the present invention is not limited to these embodiments. Further, in illustration of the drawings, the same or corresponding devices are labeled with the same reference if necessary. Further, it is noted that each drawing is schematic illustration, and the relationship between dimensions of respective devices, the ratio of respective devices, or the like may be different from the actual implementation. Portions having different dimensional relationships or ratios may also be included throughout the drawings.

First, a semiconductor laser device 1 as an example of an optical semiconductor device according to an embodiment of the present invention will be described. The semiconductor laser device 1 according to the present embodiment is an edge emission-type semiconductor laser device that oscillates the multimode laser. Note that "oscillates the multimode laser" as used herein means that a semiconductor laser device has a wide waveguide that allows a plurality of waveguide modes.

Figure 5:
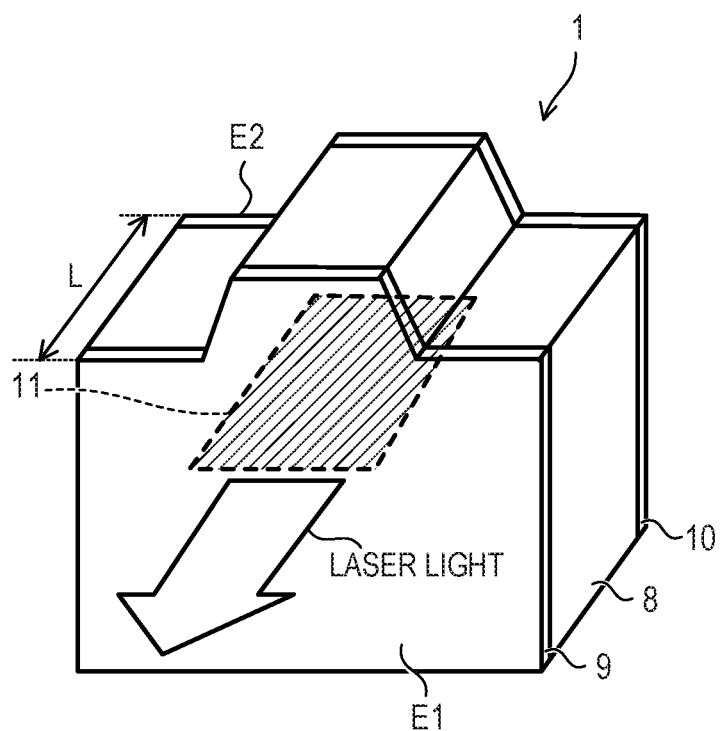
FIG. 5 is a schematic perspective view of a semiconductor laser device according to the present invention.

FIG. 5 is a schematic perspective view of the semiconductor laser device 1 according to the embodiment of the present invention. As illustrated in FIG. 5, the semiconductor laser device 1 has a semiconductor multilayer structure 8, and an active region 11 interposed between a first facet E1 on a light emitting side and a second facet E2 opposing to the first facet E1. A low reflective layer 9 having reflectivity that is lower than or equal to 10%, for example, is formed on the first facet E1 that is the light emitting side of the semiconductor multilayer structure 8, and a high reflective layer 10 having reflectivity that is higher than or equal to 90%, for example, is formed on the second facet E2 opposing to the first facet E1. The semiconductor laser device 1 guides a laser within the active region 11 and emits a laser through the low reflective layer 9 from the first facet E1.

The semiconductor laser length L of the semiconductor laser device 1 that is determined by the distance between the first facet E1 and the second facet E2 is, for example, 1 mm to 6 mm, more preferably, around 3 mm to 5 mm.

Figure 6:
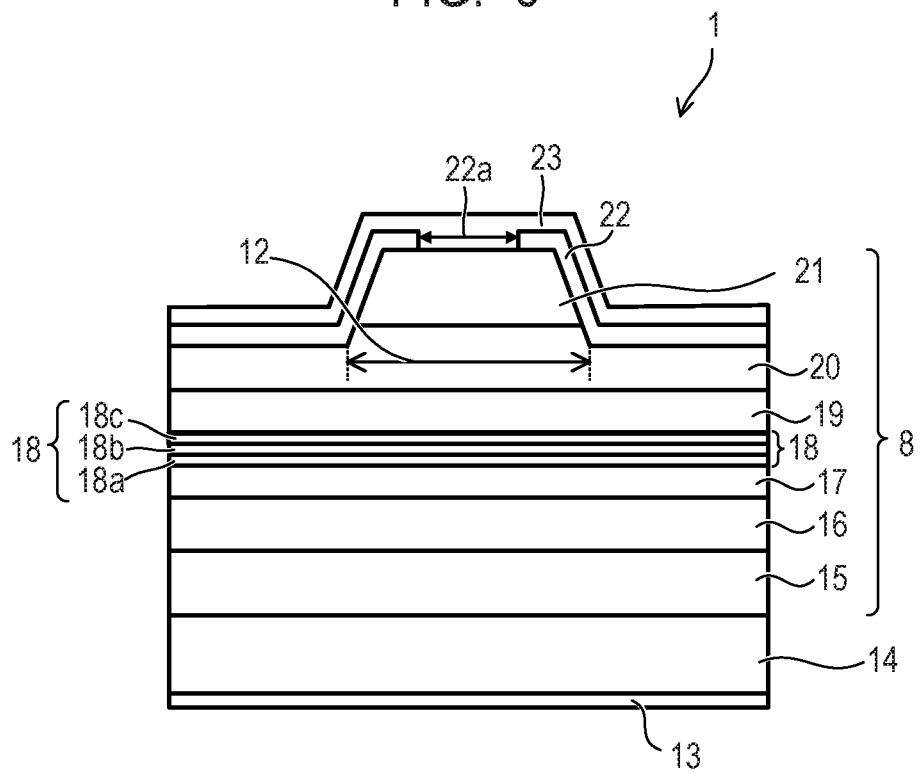
FIG. 6 is a schematic sectional view of the semiconductor laser device illustrated in FIG. 5.

FIG. 6 is an example of a sectional view of the semiconductor laser device 1 illustrated in FIG. 5. As illustrated in FIG. 6, the semiconductor laser device 1 has a first electrode layer 23 formed on the top face, a second electrode layer 13 formed on the bottom face, a substrate 14 made of n-type GaAs, the semiconductor multilayer structure 8 formed on the substrate 14, and a passivation layer 22.

The semiconductor multilayer structure 8 has an n-type buffer layer 15, an n-type clad layer 16, an n-type waveguide layer 17, an active layer 18, a p-type waveguide layer 19, a p-type clad layer 20, and a p-type contact layer 21 that are formed on the substrate 14 in this order.

The n-type buffer layer 15 is made of GaAs and is a buffer layer to grow a multilayer structure of a high quality epitaxial layer on the substrate 14. The n-type clad layer 16 and the n-type waveguide layer 17 are made of AlGaAs whose refractive index and thickness are set so as to realize a desired optical confinement factor in a stacking direction. Note that the Al composition of the n-type waveguide layer 17 is more than or equal to 20% and less than 40%, for example. Further, the reflection index of the n-type clad layer is smaller than the same of the n-type waveguide layer 17. Further, the thickness of the n-type waveguide layer 17 is preferably greater than or equal to 50 nm, for example, equal to around 1000 nm. The thickness of the n-type clad layer 16 is preferably around 1 μm to 3 μm. Further, these n-type semiconductor layers include silicon (Si), for example, as an n-type dopant.

The active layer 18 has a bottom barrier layer 18a, a quantum well layer 18b, and a top barrier layer 18c and has single quantum well (SQW) structure. The bottom barrier layer 18a and the top barrier layer 18c have a function of a barrier that confines carriers in the quantum well layer 18b and are made of high purity AlGaAs without intentional dope. The quantum well layer 18b is made of high purity InGaAs without intentional dope. The In composition and the thickness of the quantum well layer 18b and the compositions of the bottom barrier layer 18a and the top barrier layer 18c are set in accordance with a desired light emission center wavelength (for example, 900 nm to 1080 nm). Note that the structure of the active layer 18 may be multiple quantum well (MQW) structure in which a desired number of stacked structures of the quantum well layer 18b and barrier layers formed above and below the quantum well layer 18b are repeatedly arranged or may be single quantum well structure. Further, while the configuration without intentional dope on a high purity layer is illustrated above, a donor and an accepter may be intentionally added to the quantum well layer 18b, the bottom barrier layer 18a, and the top barrier layer 18c.

The p-type waveguide layer 19 and the p-type clad layer 20 are paired with the n-type clad layer 16 and the n-type waveguide layer 17 described above, respectively, and are made of AlGaAs whose refractive index and thickness are set so as to realize a desired optical confinement factor in the stacking direction. Note that the Al composition of the p-type waveguide layer 19 is greater than or equal to 20% and less than 40%, for example. The refractive index of the p-type clad layer 20 is smaller than that of the p-type waveguide layer 19. The Al composition of the p-type clad layer 20 is set slightly larger than the Al composition of the n-type clad layer 16 in order to reduce waveguide loss by adjusting a field of light in a layer to the direction of the n-type clad layer 16. The Al composition of the p-type waveguide layer 19 is then set smaller than that of the p-type clad layer 20. Further, the thickness of the p-type waveguide layer 19 is preferably greater than or equal to 50 nm, for example, equal to around 1000 nm. The thickness of the p-type clad layer 20 is preferably around 1 μm to 3 μm. Further, these p-type semiconductor layers include carbon (C) as a p-type dopant. The C concentration of the p-type waveguide layer 19 is set to, for example, 0.1 to $1.0 \times 10^{17}$ cm$^{-3}$, preferably, around 0.5 to $1.0 \times 10^{17}$ cm$^{-3}$. The C concentration of the p-type clad layer 20 is set to be greater than or equal to $1.0 \times 10^{17}$ cm$^{-3}$, for example. Further, the p-type contact layer 21 is made of GaAs doped with Zn or C at a high concentration.

The first electrode layer 23 is formed on the top face of the p-type contact layer 21. The first electrode layer 23 is made of, for example, a metal layer of Ti/Pt/Au, an alloy layer whose primary composition is Au or Zn, or the like and the thickness thereof is less than or equal to 2 μm, more preferably, 0.5 μm to 0.1 μm, for example. Au plating of a thickness of 10 to 3 μm, for example, may be formed on the top face of the first electrode layer 23 in order to obtain good electrical connection to the first electrode layer 23.

The second electrode layer 13 is formed on the bottom face of the substrate 14 made of an n-type GaAs. The second electrode layer 13 is made of, for example, an alloy layer that is composed of Au, Ge, and Ni, and the thickness thereof is less than or equal to 2 μm, more preferably, 0.5 to 0.1 μm, for example.

As illustrated in FIG. 6, a ridge structure for confining a light in the horizontal direction in FIG. 6 is formed in a region directly under an opening region 22a of the semiconductor multilayer structure 8. A waveguide width 12 determined by the width of the bottom of the ridge structure is, for example, greater than or equal to 80 µm and less than or equal to 500 µm.

The passivation layer 22 is an insulating film made of SiNx, for example, and has the opening region 22a. In the semiconductor laser device 1, current constriction to the active region 11 is achieved by restricting the contact area between the first electrode layer 23 and the semiconductor multilayer structure 8 by using the passivation layer 22.

Figure 7:
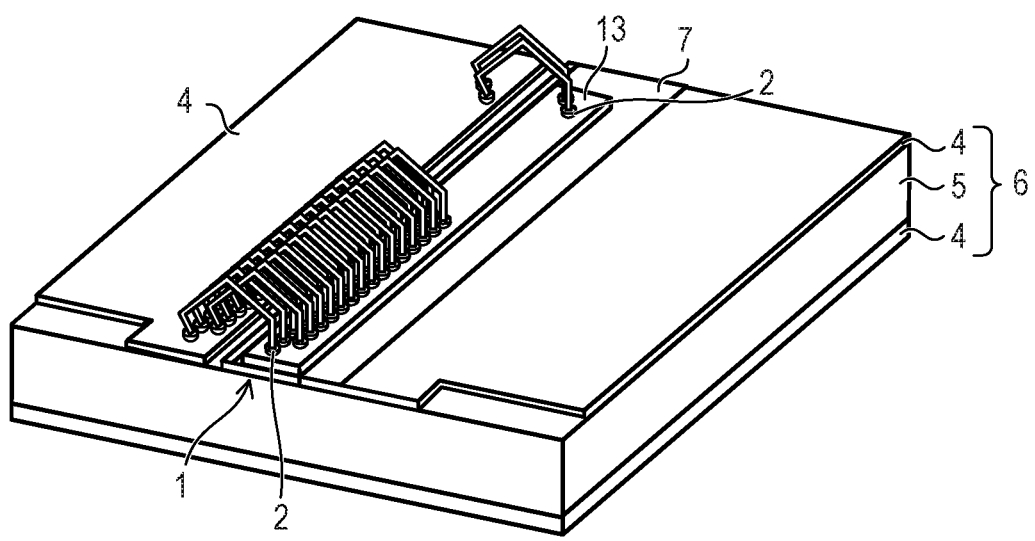
FIG. 7 is a perspective view of an example of a semiconductor laser device according to the present invention.

As illustrated in FIG. 7, the semiconductor laser device 1 formed as described above is bonded on a submount 6, in addition, the bonding wires 2 of Au or the like are connected thereto as the electrical connection region used for injecting a current to the semiconductor laser device 1, and thereby a semiconductor laser device is assembled.

As the submount 6, one in which a metal film 4 of Au or the like is formed on a substrate of a CuW alloy or the like is used, or one in which a metal film 4 of Au or the like is formed on a ceramics substrate of AlN or the like is used, for example. Further, for example, solder 7 of an AuSn alloy or the like is used to bond the semiconductor laser device 1 to the submount 6.

In general, there are two methods described below for bonding a semiconductor laser device to a submount. One of the methods is a method for bonding a semiconductor laser device to a submount via a second electrode layer and is called junction-up bonding. In the junction-up bonding, a bonding wire or the like of Au or the like is connected to a first electrode layer of a semiconductor laser device as an electrical connection region used for injecting a current to an active region, for example. The diameter of the bonding wire is 15 to 50 µm, for example.

The other method is a method for bonding a semiconductor laser device to a submount via a first electrode layer and is called junction-down bonding. In the junction-down bonding, a bonding wire or the like of Au or the like is connected to a second electrode layer of a semiconductor laser device as an electrical connection region used for injecting a current to an active region, for example. In a high power semiconductor laser device, in particular, a multi-mode laser having a waveguide width of around 80 to 500 µm, the junction-down bonding is often used.

Preferred embodiments will be described below with respect to design of an electrical connection region used for injecting a current to the active region 11 of the semiconductor laser device 1. As a specific example, in the semiconductor laser device in which a high power semiconductor laser device 1 is bonded to the submount 6 by the junction-down bonding, the configuration of the electrical connection region connected to the second electrode layer 13 of the semiconductor laser device 1 will be described. Note that, in respective drawings illustrating respective embodiments, depiction of the submount 6 and the wire part of the bonding wire 2 is omitted.

First Embodiment

Figure 8:
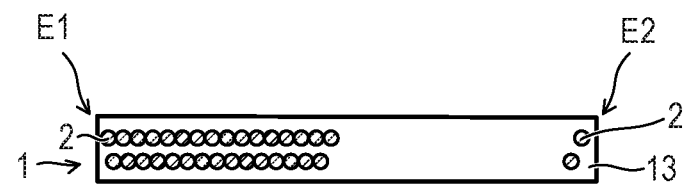
FIG. 8 is a top view illustrating the arrangement of an electrical connection region in a first embodiment of the present invention.

In the present embodiment, as the electrical connection region, the bonding wires 2 are connected to the second electrode layer 13 in a configuration illustrated in FIG. 8.

In the contact area between the electrical connection region and the second electrode layer 13 described above, the contact area included in a half region on the first facet E1 side of the top area of the semiconductor laser device 1 is denoted as α, and the contact area included in a half region on the second facet E2 side of the top area is denoted as β.

Figure 9:
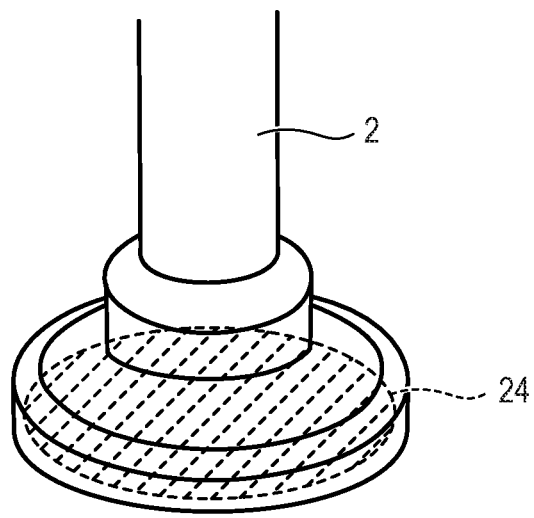
FIG. 9 is a diagram illustrating the contact area between a bonding wire and a first electrode layer or a second electrode layer.

In this case, the bonding wires 2 are connected so as to satisfy α>β. Here, a contact area 24 for every single bonding wire 2 may be defined as the area by which the end of the bonding wire 2 contacts onto the second electrode layer 13, as illustrated in FIG. 9, for example. Therefore, a value obtained by multiplying the contact area 24 per a single bonding wire 2 by the number of bonding wires 2 located in the half region on the first facet E1 side of the top area of the semiconductor laser device 1 is α, and similarly, a value obtained by multiplying the contact area 24 per a single bonding wire 2 by the number of bonding wires located in the half region on the second facet E2 side is β.

Furthermore, as illustrated in FIG. 8, at least one (in this example, two) bonding wire 2 is connected onto the second facet E2 side of the top area of the semiconductor laser device 1, and thus β>0.

Second Embodiment

Figure 10:
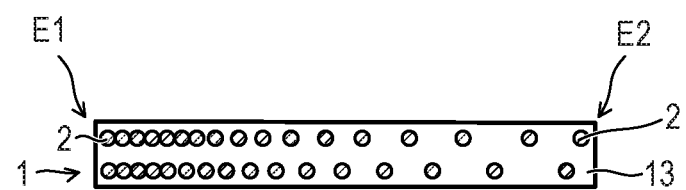
FIG. 10 is a top view illustrating the arrangement of an electrical connection region in a second embodiment of the present invention.

In the present embodiment, as the electrical connection region, the bonding wires 2 are arranged on and connected to the second electrode layer 13 in a configuration illustrated in FIG. 10. That is, α>β is satisfied, where in the contact area between the electrical connection region described above and the second electrode layer 13, the contact area included in a half region on the first facet E1 side of the top area of the semiconductor laser device 1 is denoted as α and the contact area included in a half region on the second facet E2 side of the top area is denoted as β, and at least one bonding wire 2 is connected to the second facet E2 side of the top area of the semiconductor laser device 1 and thus β>0. Furthermore, the bonding wires 2 are arranged such that the current density distribution in a direction connecting the first facet E1 and the second facet E2 inside the active region 11 of the semiconductor laser device 1 is close to the photon density distribution in the same direction.

Specifically, the optical intensity distribution inside the active region 11 of the semiconductor laser device 1 was calculated by using equations below.

The optical intensity P(z) at a distance z from the second facet E2 inside the active region 11 is expressed by equations below.

$$P(z) = A\{R_b \exp(\alpha_m z) + \exp(-\alpha_m z)\}$$

$$\alpha_m = \frac{1}{2L} \ln\left(\frac{1}{R_f R_b}\right)$$

Figure 11:
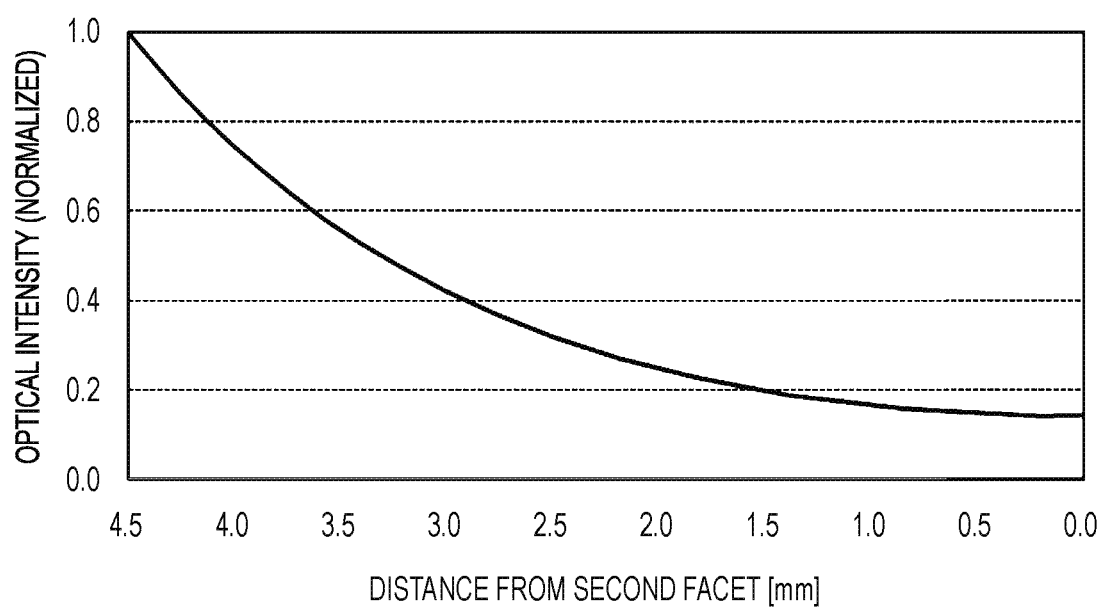
FIG. 11 is a graph illustrating an optical intensity distribution inside an active region.

Here, the value A denotes a proportional coefficient, the value Rf denotes the reflectivity of the low reflectivity layer 9 formed on the first facet E1, the value Rb denotes the reflectivity of the high reflectivity layer 10 formed on the second facet E2, and the value L is the semiconductor laser length defined by the distance between the first facet E1 and the second facet E2. In the calculation, it was assumed that Rf=0.5%, Rb=95%, and L=4.5 mm. FIG. 11 illustrates the result.

It is known that a consumption rate of carriers is higher in a region having a higher photon density, that is, a region having a larger optical density inside the active region 11. It was therefore considered that, by arranging the electrical connection region in a distribution in accordance with the optical intensity distribution illustrated in FIG. 11, it is possible to supply carriers efficiently inside the active region 11 and thus obtain a good performance semiconductor laser device. As a result, as illustrated in FIG. 10, the bonding wires 2 are arranged on and connected to the second electrode layer such that the bonding wires 2 are arranged most densely on the first facet E1 side where the optical intensity is the largest and, in a portion closer to the second facet E2 side, the density of the bonding wires 2 is reduced in proportion to a reduction in the optical intensity.

Result

Figure 1:
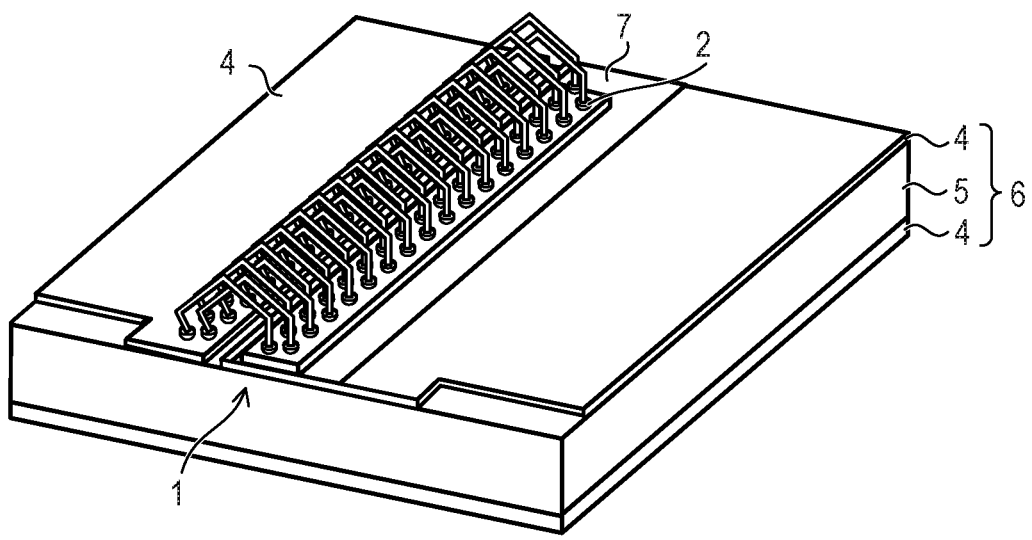
FIG. 1 is a perspective view of an example of a semiconductor laser device according to a conventional configuration.
Figure 2:
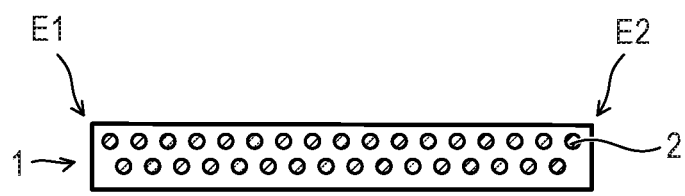
FIG. 2 is a top view illustrating the arrangement of an electrical connection region in a first conventional configuration.
Figure 3:
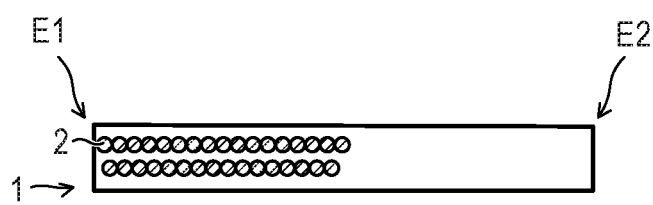
FIG. 3 is a top view illustrating the arrangement of an electrical connection region in a second conventional configuration.
Figure 4A:
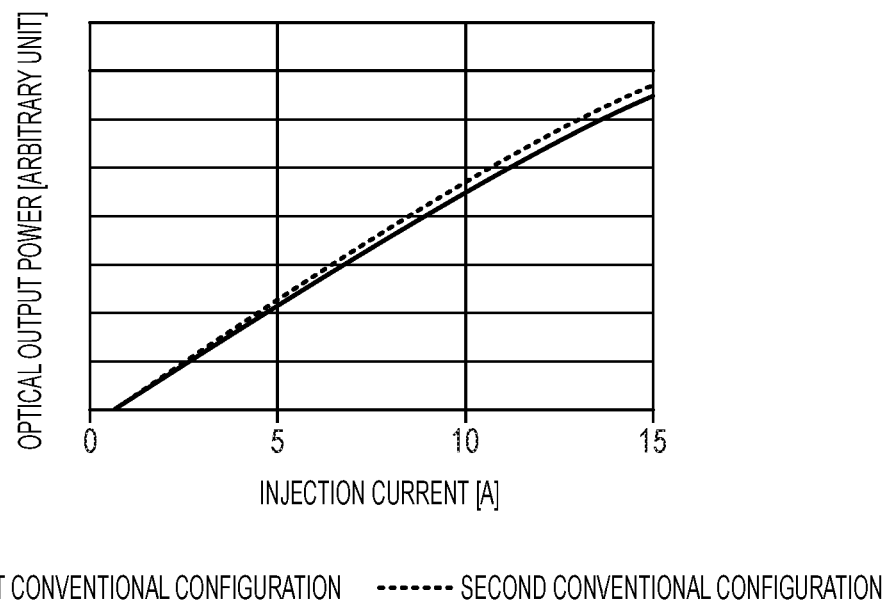
FIG. 4A is a graph illustrating a result of comparison in terms of the optical output power and the drive voltage between the first conventional configuration and the second conventional configuration.
Figure 4B:
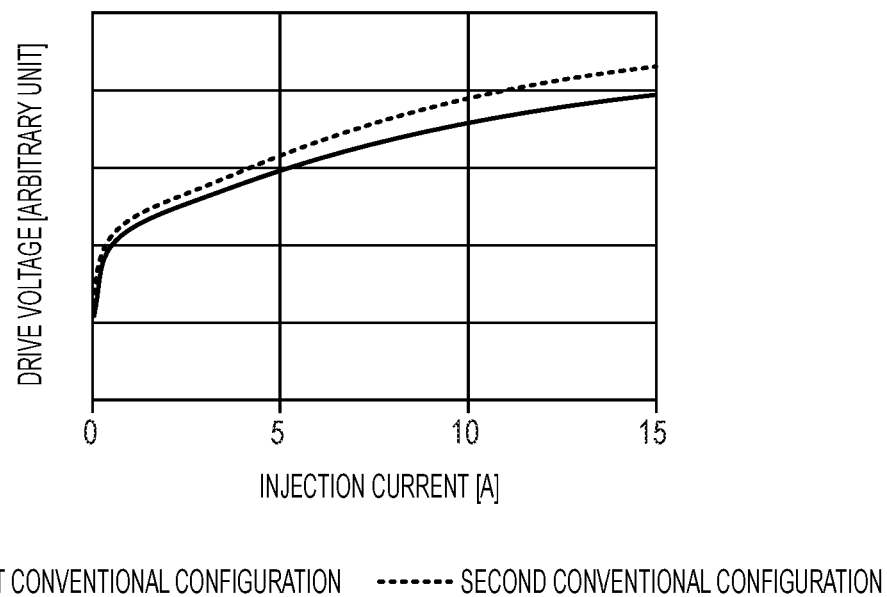
FIG. 4B is a graph illustrating a result comparison in terms of the optical output power and the drive voltage between the first conventional configuration and the second conventional configuration.
Figure 12A:
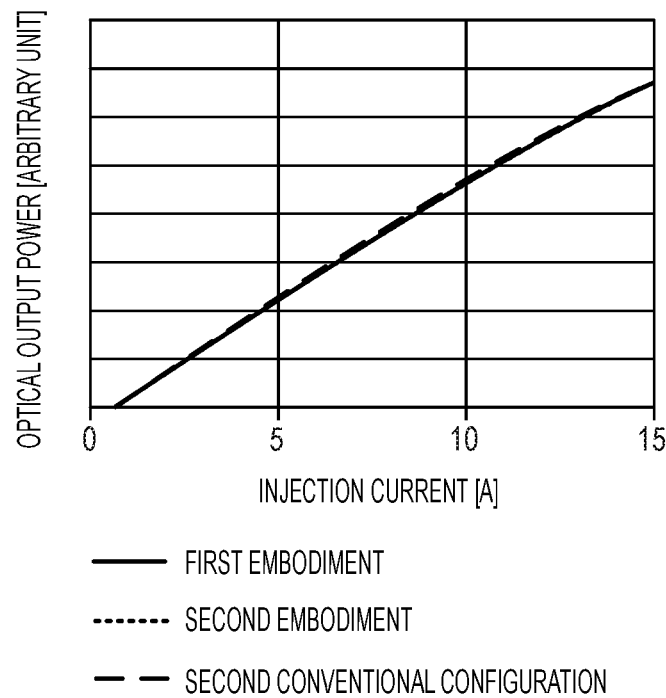
FIG. 12A is a graph illustrating a result of comparison and examination in terms of the optical output power and the drive voltage between the embodiments of the present invention and the conventional configuration.
Figure 12B:
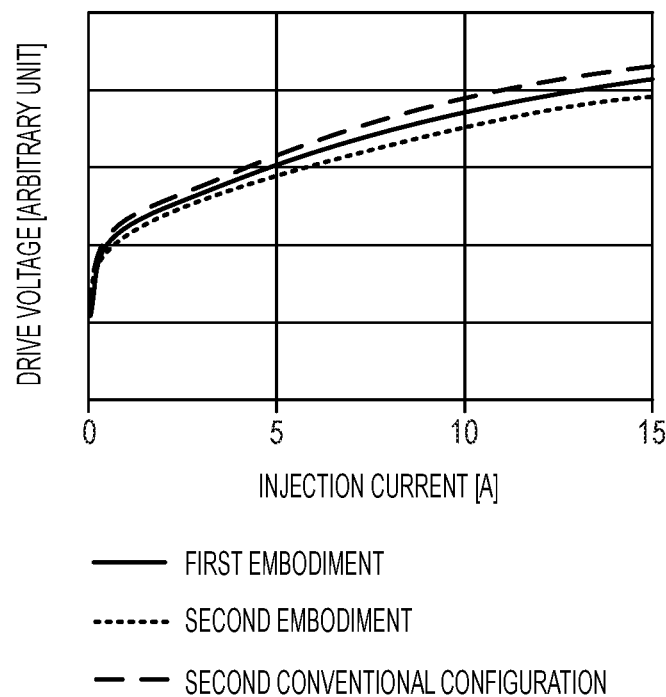
FIG. 12B is a graph illustrating a result of comparison and examination in terms of the optical output power and the drive voltage between the embodiments of the present invention and the conventional configuration.

With respect to the optical output power and the drive voltage, the first embodiment and the second embodiment were compared to the second conventional configuration in which many bonding wires 2 are located only on the first facet E1 side (the configuration in FIG. 3). FIG. 12A and FIG. 12B illustrate the results. As a result, compared to the second conventional configuration, the drive voltage was reduced in the arrangement of the bonding wires 2 of the first embodiment in which the relationship of $\alpha > \beta$ and $\beta > 0$ are satisfied, where in the contact area between the electrical connection region and the second electrode layer 13, the contact area included in a half region on the first facet E1 side of the top area of the semiconductor laser device 1 is denoted as $\alpha$ and the contact area included in a half region on the second facet E2 side is denoted as $\beta$. Moreover, the drive voltage is further reduced in the configuration of the second embodiment in which the bonding wires 2 are arranged such that the relationship of $\alpha > \beta$ and $\beta > 0$ are satisfied, where in the contact area between the electrical connection region and the second electrode layer 13, the contact area included in a half region on the first facet E1 side of the top area of the semiconductor laser device 1 is denoted as $\alpha$ and the contact area included in a half region on the second facet E2 side is denoted as $\beta$, and the current density distribution in the direction connecting the first facet E1 and the second facet E2 inside the active region 11 is close to the photon density distribution in the same direction. On the other hand, the optical output power of the first embodiment and the second embodiment was not substantially reduced compared to the optical output power of the second conventional configuration.

Figure 13A:
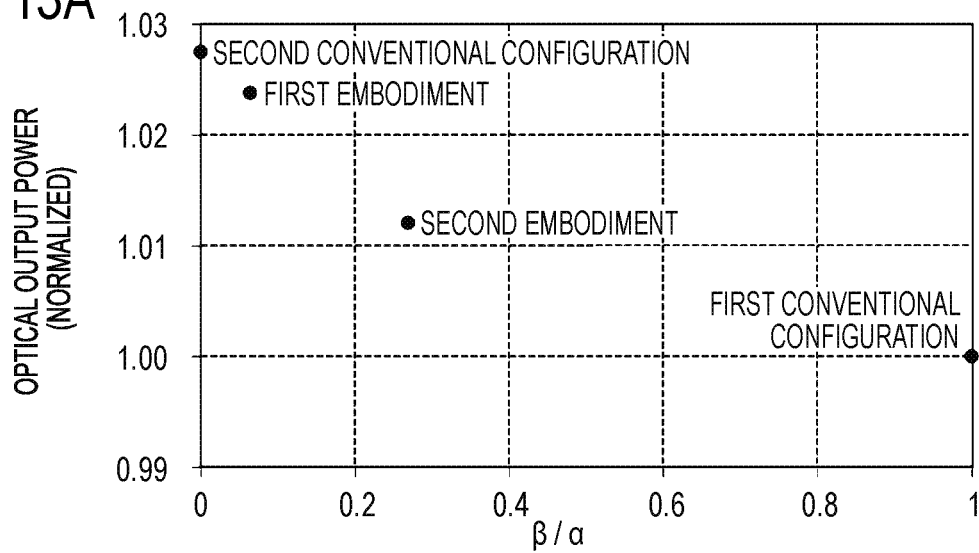
FIG. 13A is a graph illustrating an advantage of improvement in the optical output power in the embodiments of the present invention in comparison between the embodiments of the present invention and the conventional configurations.
Figure 13B:
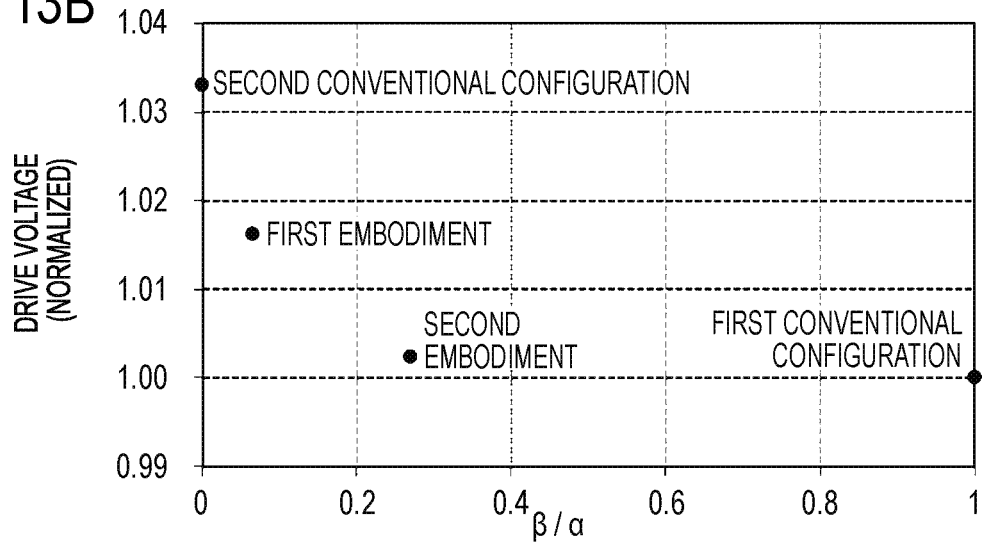
FIG. 13B is a graph illustrating an advantage of improvement in the drive voltage in the embodiments of the present invention in comparison between the embodiments of the present invention and the conventional configurations.
Figure 13C:
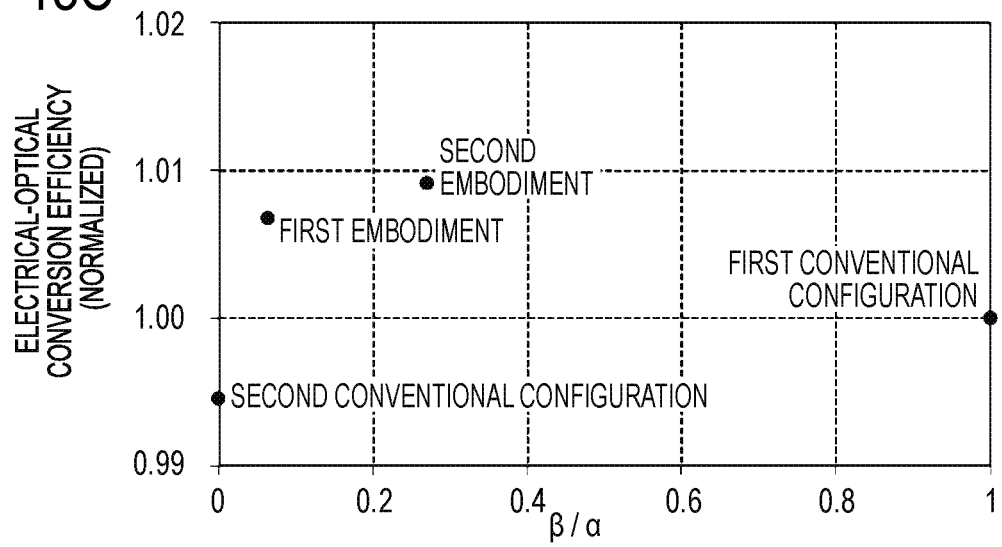
FIG. 13C is a graph illustrating an advantage of improvement in the electrical-optical conversion efficiency in the embodiments of the present invention in comparison between the embodiments of the present invention and the conventional configurations.

FIG. 13A, FIG. 13B, and FIG. 13C illustrate results of comparison in terms of the optical output power, the drive voltage, and the electrical-optical conversion efficiency between four configurations of the first conventional configuration, the second conventional configuration, the first embodiment, and the second embodiment.

As a result, the first conventional configuration in which many bonding wires are evenly arranged has the lowest WPE, and the second conventional configuration in which many bonding wires are arranged only on the first facet side has large optical output power but has a large drive voltage resulting in a poor WPE. On the other hand, according to the configurations of the first embodiment and the second embodiment, while the optical output power is slightly lower than the second conventional configuration, the drive voltage is significantly reduced, and thus the WPE is high. In particular, the WPE was the highest in the second embodiment in which the bonding wires 2 are arranged such that the relationship of $\alpha > \beta$ and $\beta > 0$ are satisfied, where in the contact area between the electrical connection region and the second electrode layer 13, the contact area included in a half region on the first facet E1 side of the top area of the semiconductor laser device 1 is denoted as $\alpha$ and the contact area included in a half region on the second facet E2 side of the top area is denoted as $\beta$, and the current density distribution in the direction connecting the first facet E1 and the second facet E2 inside the active region is close to the photon density distribution in the same direction, which indicates the most preferable arrangement of the bonding wires.

As described above, to change the performance such as the optical output power, the drive voltage, the WPE, or the like of a semiconductor laser device by changing the arrangement of the electrical connection region such as bonding wires, the electrical resistance of an electrode layer to which the electrical connection region such as the bonding wires is connected is required to be sufficiently larger than the electrical connection region such as the bonding wires.

To address this, when the electrical connection region such as the bonding wire 2 is connected to the first electrode layer 23 of the semiconductor laser device 1, for example, the thickness of the first electrode layer 23 formed of a metal layer of Ti/Pt/Au, an alloy layer whose primary component is Au or Zn, or the like, for example, is 2 µm or less, more preferably, 0.5 to 0.1 µm, for example.

Similarly, when the electrical connection region such as the bonding wire 2 is connected to the second electrode layer 13 of the semiconductor laser device 1, for example, the thickness of the second electrode layer 13 formed of an alloy layer composed of Au, Ge, and Ni or the like, for example, is 2 µm or less, more preferably, 0.5 to 0.1 µm, for example.

Third Embodiment

Figure 14:
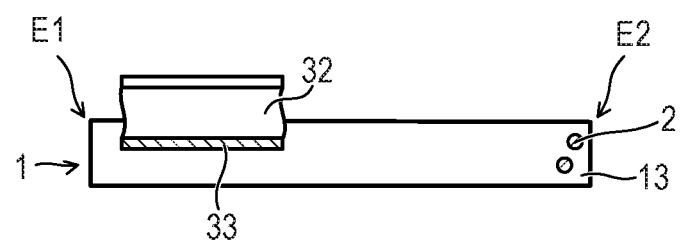
FIG. 14 is a top view illustrating a modified example of the arrangement of an electrical connection region according to the present invention.

The present embodiment is an application example of the first embodiment. As the electrical connection region, a bonding ribbon 32 that is an Au foil or the like shaped in a ribbon is connected to the second electrode layer 13 on the first facet E1 side in a configuration illustrated in FIG. 14 instead of many bonding wires 2 being connected in the first embodiment. Furthermore, at least one (in this example, two) bonding wire 2 is connected on the second facet E2 side.

Also in the present embodiment, the relationship of $\alpha > \beta$ is satisfied, where in the contact area between the electrical connection region described above and the second electrode layer 13, the contact area included in a half region on the first facet E1 side of the top area of the semiconductor laser device 1 is denoted as $\alpha$ and the contact area included in a half region on the second facet E2 side of the top area is denoted as $\beta$. Here, the contact area between the second electrode layer 13 and the bonding ribbon 32 as the electrical connection region is the area of the connection region 33 of the bonding ribbon 32. In this area of the connection region 33 of the bonding ribbon 32, the area included in the half region on the first facet E1 side of the top area of the semiconductor laser device 1 corresponds to $\alpha$. Furthermore, since at least one (in this example, two) bonding wire 2 is connected on the second facet E2 side of the top area of the semiconductor laser device 1 and thus $\beta > 0$, a good performance semiconductor laser device in which an increase of WPE is realized can be obtained as with the first embodiment.

Fourth Embodiment

Figure 15:
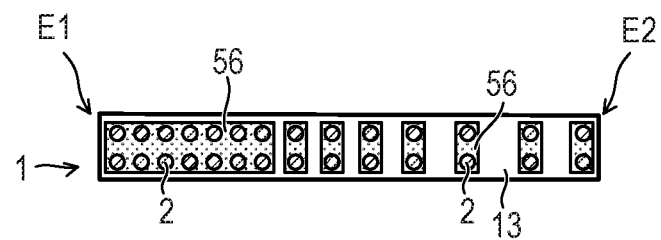
FIG. 15 is a top view illustrating a modified example of the arrangement of an electrical connection region according to the present invention.

The present embodiment is an application example of the second embodiment. That is, pads 56 are formed on the top of the second electrode layer 13 of the semiconductor laser device 1, and furthermore the bonding wires 2 are connected on the pads 56 in a configuration illustrated in FIG. 15. Each of the pads 56 is formed of Au plating or the like having a small electrical resistance, and the thickness thereof is 3 µm to 10 μm, for example. It can be considered that the pad 56 and the bonding wire 2 connected on the pad 56 have the same electric potential. Therefore, in the present embodiment, the pads 56 correspond to the electrical connection region connected to the second electrode layer 13 of the semiconductor laser device 1.

Also in the present embodiment, the relationship of $\alpha > \beta$ is satisfied, where in the contact area between the electrical connection region described above and the second electrode layer 13, the contact area included in a half region on the first facet E1 side of the top area of the semiconductor laser device 1 is denoted as $\alpha$ and the contact area included in a half region on the second facet E2 side of the top area is denoted as $\beta$. Here, the contact area between the electrical connection region and the second electrode layer 13 corresponds to the areas of the pads 56. In the areas of the pads 56, the sum of the areas included in the half region on the first facet E1 side of the top area of the semiconductor laser device 1 corresponds to $\alpha$, and similarly, the sum of the areas included in the half region on the second facet E2 side corresponds to $\beta$. Further, at least one pad 56 is located on the second facet E2 side of the top area of the semiconductor laser device 1, and thus $\beta > 0$.

Furthermore, in the present embodiment, the pads 56 are formed on the second electrode layer 13 of the semiconductor laser device 1 such that the current density distribution in the direction connecting the first facet E1 and the second facet E2 inside the active region 11 of the semiconductor laser device 1 is close to the photon density distribution in the same direction. Therefore, the present embodiment is one example of the most preferable arrangement of the electrical connection region, and a good performance semiconductor laser device in which an increase in WPE is realized can be obtained as with the second embodiment.

Fifth Embodiment

Figure 16:
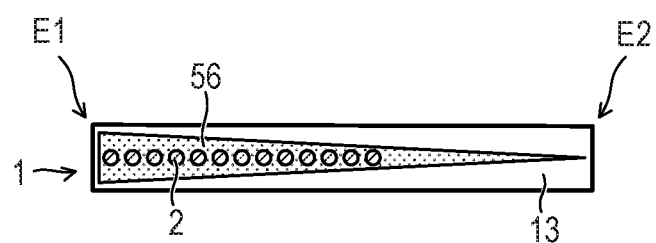
FIG. 16 is a top view illustrating a modified example of the arrangement of an electrical connection region according to the present invention.

The present embodiment is an application example of the second embodiment. That is, a substantially triangular pad 56 is formed on the top of the second electrode layer 13 of the semiconductor laser device 1 such that the first facet E1 side of the semiconductor laser device 1 corresponds to the base and the second facet E2 side corresponds to the vertex in a configuration as illustrated in FIG. 16. Furthermore, the bonding wires 2 are connected onto the pad 56. The pad 56 is formed of an Au plating or the like having a small electrical resistance, and the thickness thereof is 3 μm to 10 μm, for example. It can be considered that the pad 56 and the bonding wire 2 connected on the pad 56 have the same electric potential. Therefore, in the present embodiment, the pad 56 corresponds to the electrical connection region connected to the second electrode layer 13 of the semiconductor laser device 1 as with the fourth embodiment.

Also in the present embodiment, the relationship of $\alpha > \beta$ is satisfied, where in the contact area between the electrical connection region described above and the second electrode layer 13, the contact area included in a half region on the first facet E1 side of the top area of the semiconductor laser device 1 is denoted as $\alpha$ and the contact area included in a half region on the second facet E2 side of the top area is denoted as $\beta$. Here, the contact area between the electrical connection region and the second electrode layer 13 corresponds to the area of the pad 56. In the present embodiment, while the integrated pad 56 is arranged, in the area of the pad 56, the area of a portion included in the half region on the first facet E1 side of the top area of the semiconductor laser device 1 corresponds to $\alpha$, and similarly, the area of a portion included in the half region on the second facet E2 side corresponds to $\beta$. Further, the pad 56 has a substantially triangular shape such that the second facet E2 side of the top area of the semiconductor laser device 1 corresponds to the vertex, and thus $\beta > 0$.

Furthermore, in the present embodiment, the pad 56 is formed on the second electrode layer 13 of the semiconductor laser device 1 such that the current density distribution in the direction connecting the first facet E1 and the second facet E2 inside the active region 11 of the semiconductor laser device 1 is close to the photon density distribution in the same direction. That is, the width of the pad 56 (the width orthogonal to the direction connecting the first facet E1 and the second facet E2) is the largest on the first facet E1 side of the semiconductor laser device 1 and decreases as approaching the second facet E2 side in accordance with the optical intensity distribution illustrated in FIG. 11. In such a way, by designing the shape of the pad 56 as the electrical connection region connected to the second electrode layer 13 of the semiconductor laser device 1, it is possible to supply carriers efficiently inside the active region 11. Therefore, the present embodiment is one example of the most preferable configuration of the electrical connection region, and a good performance semiconductor laser device in which an increase in WPE is realized can be obtained as with the second embodiment.

While the case where the semiconductor laser device 1 is bonded to the submount 6 via the first electrode layer 23 (by junction-down bonding) and one or more pads 56 are formed as the electrical connection region on the second electrode layer 13 of the semiconductor laser device 1 has been described in the fourth embodiment and the fifth embodiment, the same advantage can be obtained even when one or more pads 56 as illustrated in the fourth embodiment or the fifth embodiment are formed as the electrical connection region on the first electrode layer 23 of the semiconductor laser device 1 and the semiconductor laser device 1 is then bonded to the submount 6 via the pad(s) 56 formed on the first electrode layer 23.

Sixth Embodiment

Figure 17:
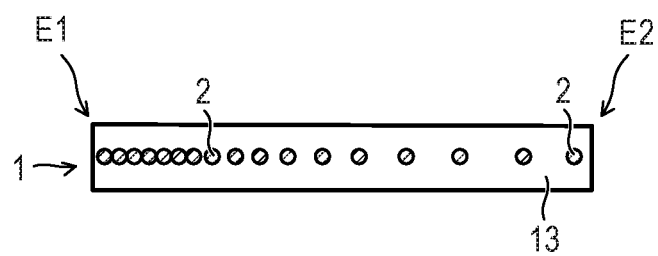
FIG. 17 is a top view illustrating a modified example of the arrangement of an electrical connection region according to the present invention.

The present embodiment is a modified example of the second embodiment. That is, as the electrical connection region, the bonding wires 2 are arranged on and connected to the second electrode layer 13 of the semiconductor laser device 1 not in the form of two lines but in the form of a single line in a configuration illustrated in FIG. 17.

In a case of a semiconductor laser device having the optical output power around 10 mW to 2 W, for example, which injects a current around 10 mA to 3 A, for example, the bonding wires are not necessarily required to be formed in two lines. It is not preferable to connect more bonding wires than is needed to the electrode layer of the semiconductor laser device, because such connection causes disadvantages of an increase in cost of the material such as Au, an increase in process tact time, or the like.

In the present embodiment, the relationship of $\alpha > \beta$ is satisfied, where in the contact area between the electrical connection region described above and the second electrode layer 13, the contact area included in a half region on the first facet E1 side of the top area of the semiconductor laser device 1 is denoted as $\alpha$ and the contact area included in a half region on the second facet E2 side of the top area is denoted as $\beta$, and at least one bonding wire 2 is connected on the second facet E2 side of the top area of the semiconductor laser device 1 and thus $\beta > 0$. Furthermore, the bonding wires 2 are arranged in a form of a single line such that the current density distribution in the direction connecting the first facet E1 and the second facet E2 inside the active region 11 of the semiconductor laser device 1 is close to the photon density distribution in the same direction. Therefore, in a semiconductor laser device of the optical output power around 10 mW to 2 W, for example, the present embodiment is one example of the most preferable arrangement of the electrical connection region, and a good performance semiconductor laser device in which an increase in WPE is realized can be obtained.

While the case where the semiconductor laser device is bonded to the submount by junction-down bonding and the electrical connection region is connected to or formed on the second electrode layer has been described in the above embodiments, the semiconductor laser device may be bonded to the submount by junction-up bonding, and the electrical connection region may be connected to or formed on the first electrode layer.

While the case where the optical semiconductor device is a semiconductor laser device has been described in the above embodiments, the type of the optical semiconductor device is not particularly limited. For example, the optical semiconductor device may be a semiconductor optical amplifier which is input with a laser from the second facet and outputs a laser whose optical output power is 10 mW or higher from the first facet. Further, the optical semiconductor device may be a semiconductor integrated circuit device in which a semiconductor laser device and an optical semiconductor amplifier are integrated.

What is claimed is:

1. An optical semiconductor device comprising:
   an optical semiconductor device including
      a semiconductor multilayer structure,
      an active region interposed between a first facet on a light emitting side and a second facet opposing to the first facet, and
      a first electrode layer provided on a top of the semiconductor multilayer structure and a second electrode layer provided on a bottom of the semiconductor multilayer structure; and
   an electrical connection region connected to at least one of the first electrode layer and the second electrode layer of the optical semiconductor device and used for injecting a current to the active region,
   wherein $\alpha>\beta$ and $\beta>0$ are satisfied, where in a contact area between the electrical connection region and the optical semiconductor device, the contact area included in a half region on the first facet side in a top area of the optical semiconductor device is denoted as $\alpha$, and the contact area in the top area in a half region toward or on the second facet side is denoted as $\beta$, and $\alpha$ and $\beta$ are connected on the same electrode layer of at least one of the first electrode layer and the second electrode layer,
   wherein the semiconductor multilayer structure is provided with a contact layer, and the first electrode layer is provided on an upper surface of the contact layer in both $\alpha$ and $\beta$,
   wherein a part of the electrical connection region connected to the half region on the second facet side in a top area of the optical semiconductor device is located near the second facet, and
   wherein the optical semiconductor device is a semiconductor laser device in which the optical output power of a light emitting from the first facet is greater than or equal to 100 mW.

2. An optical semiconductor device comprising:
   an optical semiconductor device including
      a semiconductor multilayer structure,
      an active region interposed between a first facet on a light emitting side and a second facet opposing to the first facet, and
      a first electrode layer provided on a top of the semiconductor multilayer structure and a second electrode layer provided on a bottom of the semiconductor multilayer structure; and
   an electrical connection region connected to at least one of the first electrode layer and the second electrode layer of the optical semiconductor device and used for injecting a current to the active region,
   wherein $\alpha>\beta$ and $\beta>0$ are satisfied, and $\alpha$ and $\beta$ are connected on the same electrode layer of at least one of the first electrode layer and the second electrode layer, where in a contact area between the electrical connection region and the optical semiconductor device, the contact area included in a half region on the first facet side in a top area of the optical semiconductor device is denoted as $\alpha$, and the contact area in the top area in a half region toward or on the second facet side is denoted as $\beta$, and wherein the optical semiconductor device is a semiconductor optical amplifier device that is inputted with a laser from the second facet and outputs, from the first facet, the optical output power is greater than or equal to 10 mW.

3. An optical semiconductor device comprising:
   an optical semiconductor device including
      a semiconductor multilayer structure,
      an active region interposed between a first facet on a light emitting side and a second facet opposing to the first facet, and
      a first electrode layer provided on a top of the semiconductor multilayer structure and a second electrode layer provided on a bottom of the semiconductor multilayer structure; and
   an electrical connection region connected to at least one of the first electrode layer and the second electrode layer of the optical semiconductor device and used for injecting a current to the active region,
   wherein $\alpha>\beta$ and $\beta>0$ are satisfied, where in a contact area between the electrical connection region and the optical semiconductor device, the contact area included in a half region on the first facet side in a top area of the optical semiconductor device is denoted as $\alpha$, and the contact area in the top area in a half region toward or on the second facet side is denoted as $\beta$, and $\alpha$ and $\beta$ are connected on the same electrode layer of at least one of the first electrode layer and the second electrode layer,
   wherein the semiconductor multilayer structure is provided with a contact layer, and the first electrode layer is provided on an upper surface of the contact layer in both $\alpha$ and $\beta$,
   wherein a part of the electrical connection region connected to the half region on the second facet side in a top area of the optical semiconductor device is located near the second facet, and
   wherein the optical output power from the first facet is greater than or equal to 1 W, and the optical semiconductor device is a semiconductor laser device that oscillates the multimode laser.

* * * * *